US010746790B1

(12) United States Patent
Cook Lobo et al.

(10) Patent No.: US 10,746,790 B1
(45) Date of Patent: Aug. 18, 2020

(54) CONSTRAINED PSEUDORANDOM TEST PATTERN FOR IN-SYSTEM LOGIC BUILT-IN SELF-TEST

(71) Applicant: International Business Machines Corporation, Armonk, NY (US)

(72) Inventors: Alejandro Alberto Cook Lobo, Stuttgart (DE); Thomas Gentner, Boeblingen (DE); Daniel Kiss, Stuttgart (DE); Jens Kuenzer, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/363,382

(22) Filed: Mar. 25, 2019

(51) Int. Cl.
*G01R 31/317* (2006.01)
*G01R 31/3177* (2006.01)

(52) U.S. Cl.
CPC ... *G01R 31/31701* (2013.01); *G01R 31/3177* (2013.01); *G01R 31/31724* (2013.01)

(58) Field of Classification Search
CPC ........ G01R 31/31701; G01R 31/31724; G01R 31/3177
See application file for complete search history.

(56) References Cited

U.S. PATENT DOCUMENTS

| | | | | |
|---|---|---|---|---|
| 5,925,144 | A * | 7/1999 | Sebaa | G01R 31/31813 714/30 |
| 6,327,687 | B1 * | 12/2001 | Rajski | G01R 31/318335 714/738 |
| 6,684,358 | B1 * | 1/2004 | Rajski | G01R 31/31813 714/728 |
| 7,346,823 | B1 * | 3/2008 | Maheshwari | G01R 31/318547 714/733 |
| 7,552,373 | B2 | 6/2009 | Wang et al. | |
| 7,840,865 | B2 | 11/2010 | Lai et al. | |
| 9,588,177 | B1 * | 3/2017 | Atwood | G01R 31/31707 |
| 2003/0115525 | A1 * | 6/2003 | Hill | G01R 31/31854 714/726 |

(Continued)

OTHER PUBLICATIONS

Al-Yamani, A.A., "Optimized Reseeding by Seed Ordering and Encoding", IEEE Transactions on Computer-Aided Design of Integrated Circuits and Systems, IEEE, vol. 24, Issue: 2, Feb. 2005, pp. 264-270. (Year: 2005).*

(Continued)

*Primary Examiner* — Kyle Vallecillo
(74) *Attorney, Agent, or Firm* — Cantor Colburn LLP; Erik Johnson

(57) ABSTRACT

Embodiments of the invention are directed to a built-in self-test system for an electronic circuit. The system includes a memory having two or more base seeds stored thereon. The system further includes seed generation logic configured to generate, based at least in part on the two or more base seeds, a plurality of generated seeds. The generated seeds can be constructed from the base seeds such that each of the generated seeds encodes a test pattern that satisfies a functional constraint. A finite state machine is configured to generate, based on the plurality of generated seeds, a sequence of constrained pseudorandom test patterns. A test controller is operable to place the electronic circuit into a test mode based on the constrained pseudorandom test pattern.

20 Claims, 5 Drawing Sheets

(56) References Cited

U.S. PATENT DOCUMENTS

| | | | | |
|---|---|---|---|---|
| 2003/0120988 A1* | 6/2003 | Rajski | ............... | G01R 31/31813 |
| | | | | 714/726 |
| 2010/0050031 A1* | 2/2010 | Gass | ................ | G01R 31/31725 |
| | | | | 714/733 |
| 2010/0218059 A1* | 8/2010 | Gangasani | ..... | G01R 31/318385 |
| | | | | 714/728 |
| 2011/0214026 A1* | 9/2011 | Rajski | ............ | G01R 31/318547 |
| | | | | 714/726 |
| 2014/0006888 A1* | 1/2014 | Rajski | ............ | G01R 31/318547 |
| | | | | 714/727 |
| 2016/0003900 A1* | 1/2016 | Narayanan | ....... | G01R 31/31855 |
| | | | | 714/726 |
| 2016/0003907 A1* | 1/2016 | Rasjki | ............ | G01R 31/318547 |
| | | | | 714/738 |
| 2018/0017622 A1 | 1/2018 | Rajski et al. | | |
| 2018/0074122 A1* | 3/2018 | Payne | ................ | G01R 31/3177 |

OTHER PUBLICATIONS

Mukherjee, et al., "Embedded Deterministic Test," IEEE Transactions on Computer-Aided Design of Integrated Circuits and Systems, vol. 23, No. 5, May 2004, pp. 776-792 (17 pages).

Touba, et al., "Altering a Pseudo-Random Bit Sequence for Scan-Based Bist," Center for Reliable Computing Departments of Electrical Engineering and Computer Science: International Test Conference (1996), pp. 167-175 (9 pages).

\* cited by examiner

CONSTRAINED PSEUDORANDOM TEST PATTERN FOR IN-SYSTEM LOGIC BUILT-IN SELF-TEST

BACKGROUND

The present invention relates to digital computer systems, and more particularly, to built-in self-test systems.

Integrated circuits are increasing in complexity to meet the demand of new, sophisticated applications. For example, it has become more common in recent years to include specialized processing blocks in configurable devices. Such types of specialized processing blocks—commonly referred to as logic blocks or cores—can include a concentration of circuitry (e.g., digital signal processing blocks or DSP blocks in signal processing applications) that is partly or fully hardwired to perform one or more specific tasks, such as a logical or a mathematical operation.

To ensure the satisfactory operation of a device, several test-related activities can be pursued. For example, manufacturing tests ensure device quality, system debug tests support system bring-up and ensure that a chip functions properly after the chip has been integrated into its surrounding system (e.g., board), and field tests guarantee system reliability. These activities can make use of internal test support circuitry (e.g., on-chip design-for-test infrastructure), which needs to be defined in early design stages of the device.

Internal test support circuitry is sometimes referred to as built-in self-test (BIST) circuitry. One type of BIST circuitry, the Logic Built-In Self-Test (LBIST), originally designed for in-field and system tests, has been recently applied in manufacturing tests, where it usually complements deterministic schemes based on test pattern compression. The LBIST Design-for-Test (DfT) infrastructure is selected during chip design and is configured during post-silicon validation and yield learning to debug and diagnose a wide range of test issues.

SUMMARY

Embodiments of the present invention are directed to a built-in self-test system. A non-limiting example of the system includes a memory having two or more base seeds stored thereon. The system further includes seed generation logic configured to generate, based at least in part on the two or more base seeds, a plurality of generated seeds. The generated seeds can be constructed from the base seeds such that each of the generated seeds encodes a test pattern that satisfies a functional constraint. A finite state machine is configured to generate, based on the plurality of generated seeds, a sequence of constrained pseudorandom test patterns. A test controller is operable to place the electronic circuit into a test mode based on the constrained pseudorandom test pattern.

Embodiments of the present invention are directed to a method for generating a constrained pseudorandom test pattern for a BIST of an electronic circuit. A non-limiting example of the method includes identifying two or more base seeds such that a combination of the two or more base seeds produces a test pattern that satisfies a functional constraint. The method can include generating, based at least in part on the two or more base seeds, a plurality of generated seeds such that each of the generated seeds encodes a test pattern that satisfies the functional constraint. The method can include generating, based on the plurality of generated seeds, a sequence of a constrained pseudorandom test pattern and placing the electronic circuit into a test mode based on the constrained pseudorandom test pattern.

Embodiments of the present invention are directed to a computer program product for generating a constrained pseudorandom test pattern for a BIST of an electronic circuit. A non-limiting example of the computer program product includes program instructions executable by an electronic computer processor to control the computer system to perform operations. The operations can include identifying two or more base seeds such that a combination of the two or more base seeds produces a test pattern that satisfies a functional constraint. The operations can include generating, based at least in part on the two or more base seeds, a plurality of generated seeds such that each of the generated seeds encodes a test pattern that satisfies the functional constraint. The operations can include generating, based on the plurality of generated seeds, a sequence of a constrained pseudorandom test pattern and placing the electronic circuit into a test mode based on the constrained pseudorandom test pattern.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
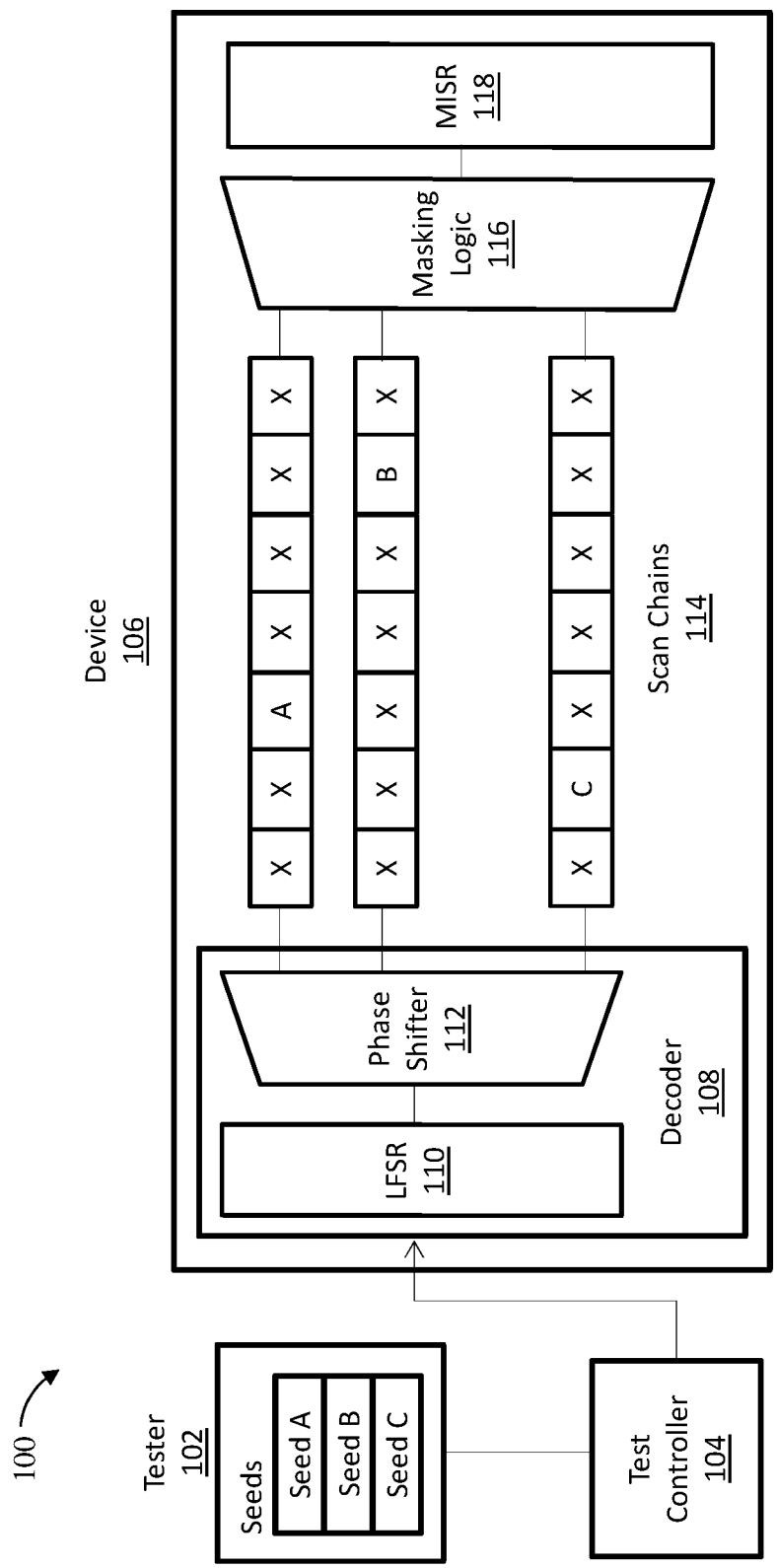
FIG. 1 illustrates a block diagram of a built-in self-test architecture in accordance with various embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, as discussed previously herein, some internal test support circuitry, such as the LBIST Design-for-Test (DfT) infrastructure, is selected during chip design and is configured during post-silicon validation and yield learning to debug and diagnose a wide range of test issues. One challenge for LBIST DfT infrastructures is that a chip may be tested at system-level under very different conditions than those used in manufacturing tests. Therefore, test engineers face the challenging task of debugging an LBIST procedure without removing the chip from its target board. Due to its inherent low controllability, LBIST debug is already a difficult task, which becomes even more challenging during a system test, where no automated test equipment (ATE) is available.

FIG. 1 illustrates an example of a conventional BIST architecture 100. The BIST architecture 100 can be configured to operate under a wide range of conditions, such as, for example, voltage, frequency, system state, power, and/or input stimuli. The BIST architecture 100 can include a tester 102, a test controller 104, and a device under test 106 (hereinafter, device 106). The device 106 can include an on-board (or on-chip) decoder 108. The decoder 108 can include a linear feedback shift register (LFSR) 110 and a phase shifter 112. The device 106 can also include scan chains 114, masking logic 116, and a multiple-input signature register (MISR) 118.

The LFSR 110 can be initialized by the test controller 104 to a particular value or seed. The seeds are generally stored on-chip in read only memory (ROM) and during self-test these seeds are periodically loaded into the LFSR 110 to generate test patterns. In some configurations, the LFSR 110 can use the seeds to generate a new unique test pattern each capture cycle. The patterns generated are repeatable but appear random. In this manner, the LFSR 110 can function as a pseudo-random pattern generator (PRPG). The patterns from the LFSR 110 can be passed to the phase shifter 112. In some embodiments of the invention, the phase shifter 112 is configured to avoid linear dependencies that comprise test coverage.

The scan chains 114 are configured with registers that define the internal state of a circuit under test (CUT) or design under test (DUT) of the device 106. To initialize a test, data is loaded in a test mode into the registers via the scan chains 114. In the test mode, each scan chain of the scan chains 114 provides a serial path between an input, some of the data registers of the CUT, and an output. Such an arrangement permits setting the conditions of the CUT into a desired state by scanning in the appropriate test data.

After loading the test data, the CUT operates in a normal mode responsive to its own clock signal for some test interval (e.g., one or a few capture cycles). The internal state of the CUT can then be output via the scan chains 114 to masking logic 116 and the MISR 118. The state of the output of the MISR 118 can be compared to a known (or expected) fault-free signature. In this manner, the internal state of the CUT can be compared with an expected internal state. Mismatches can be identified and can form the basis for further testing, debugging, correction, decertification, decommission, etc.

While the conventional BIST architecture has greatly improved the testing of integrated circuits, the debugging and diagnosis of a BIST procedure remain challenging. In an ideal test scenario, a device under test would be subjected to a wide range of test conditions. This is easy with automated testing equipment (ATE), but ATEs are usually not an option once a chip is integrated into a system.

Another limitation of conventional systems is the expense associated with the incorporation of functional constraints into the input stimuli. An example of a functional constraint is a constrained pseudorandom test pattern. These types of patterns are desirable for many applications, including debugging, fencing, masking false paths, minimizing or maximizing activity in a logic cone, arbitrarily constraining a logic cone, etc.

A pseudorandom test pattern defines a sequence of length N where each value in the sequence is randomly generated. A constrained pseudorandom pattern similarly defines a sequence of length N, but some values (positions) in the sequence are fixed (constrained). The fixed values in a constrained pseudorandom pattern need not be consecutive and any number of the values can be fixed. For example, consider the following constrained pseudorandom binary patterns:

Pattern 1: XX1100XXXXXX
Pattern 2: XX1100XXXXXX
Pattern N: XX1100XXXXXX

Here, the "X" value denotes either logic value "0" or "1." Each of these patterns is an example of a constrained pseudorandom pattern, with the third, fourth, fifth, and sixth elements fixed ("1100").

Constrained pseudorandom test patterns may differ from test to test, depending on the needs of the functional constraint in a given application. As discussed previously herein, the LFSR 110 can be initialized by the test controller 104 to a particular value or seed, and these seeds are generally stored on-chip. To accommodate field-tests having functional constraints, conventional logic BISTs require a large number of seeds.

Storing enough seeds to generate a sufficient number of test patterns, and therefore, acceptable test coverage, requires a large on-chip memory. Large on-chip memories can be very expensive to implement, especially as the number of supported functional constraints increases. Field tests using traditional logic BIST techniques and architectures thus generally suffer from either low coverage or large overhead from the required on-chip memory for seed storage.

Some conventional systems try to address this issue by reusing design-for-test infrastructure. The most widely used piece of LBIST DfT infrastructure, namely, the STUMPS architecture, makes use of a pseudo-random pattern-generator (PRPG), which autonomously produces a sequence of test patterns. The main goal of these approaches is to achieve sufficient fault coverage while optimizing other test metrics like hardware overhead, test time or power consumption.

For example, an on-chip pattern generator and masking/weighting logic can be used to generate scan chains. This approach is limited, however, and does not support arbitrary functional constraints. For weighted pseudorandom pattern generation, each bit in the test pattern is generated with a fixed probability to increase the chance of detecting hard-to-detect faults with moderate hardware cost. While these approaches increase the probability that certain bits are fixed to logic 1 or logic 0, they don't guarantee that an arbitrary set of bits is tied to fixed values throughout the whole test pattern sequence.

Other popular approaches improve fault coverage and reduce test time by combining pseudorandom patterns with top-off deterministic patterns, which are encoded and stored on-chip. Although deterministic patterns can be replaced and, therefore, provide more flexibility for system-test, a test solution using only deterministic patterns would be very expensive in terms of storage. Another group of techniques makes use of a piece of logic circuitry to modify the output sequence of a pseudorandom pattern generator. Although these types of systems are effective to enhance fault coverage or reduce power during test, they only provide coarse-grain control of the generated sequence and are unlikely to fulfill an arbitrary logical constraint in system-test.

Turning now to an overview of the aspects of the inventive teachings, one or more embodiments address the above-described shortcomings of the prior art by providing a new BIST architecture for providing constrained pseudorandom test patterns for in-system logic built in self tests. This BIST architecture enables a new method to program arbitrary logic constraints into a sequence of pseudorandom patterns, which allows test engineers to gain fine-grained control of the test stimuli of an LBIST session during system-level test. The constrained LBIST stimuli can be used to represent a wide array of test scenarios like, for example, functional configurations, different distributions of unknown values, or the activation and deactivation of critical paths. It can be used to gain detailed insight into the conditions leading to the observed errors or to confirm proposed solutions to the problem.

This new BIST architecture produces a sequence of constrained pseudorandom patterns, where an arbitrary set of logic bits can be fixed to logic 0 or logic 1 throughout the entire test pattern set. These constraints are independent from the device's scan chain configuration and offer increased flexibility in the stimuli generation during LBIST system debug. In some embodiments of the invention, encoded seeds are computed from base seeds and a linear feedback shift-register (LFSR) decodes test patterns based on the encoded seeds during a test application.

In some embodiments of the invention, the set of encoded seeds (sometimes referred to as "generated seeds") is the result of the linear combination of a much lower number of base seeds plus a fixed offset seed. In some embodiments of the invention, the fixed offset seed contains the logic "1" constraints, while the remaining base seeds contain the logic "0" constraints. Advantageously, only the base and offset seeds need to be temporarily stored in-system, as the encoded seeds can be generated as needed (e.g., as a linear combination of some base seeds plus the fixed offset seed).

In some embodiments of the invention, the base seeds are carefully calculated so that each of their different linear combinations produces a valid constrained pseudorandom pattern. In some embodiments of the invention, the encoded seeds are used to generate test patterns. In this manner, a small number of base seeds can be used to generate a larger number of encoded seeds. So constructed, the total number of generated test patterns grows exponentially with the number of stored seeds. In particular, this improved BIST architecture allows for "N" seeds to span $2^{N-1}$ test patterns, greatly reducing the required on-chip memory for seed storage. For example, 20 base seeds produce over 1 million test patterns. Advantageously, this new BIST architecture requires very little additional storage and minimal modifications to the conventional LBIST application engine. This BIST architecture can be used for system debug, diagnosis, and field testing. Its implementation can be seamlessly integrated into the traditional test architecture used for manufacturing test.

To illustrate the generation of a large number of test patterns from relatively few base seeds, consider a desired constrained sequence: XX0000XXXXXX. The base pattern encoding for such a sequence can include N seeds that produce patterns that satisfy a functional constraint ("0000" starting at the $3^{rd}$ position in the sequence), where:

Seed 1: 100000110001
Seed 2: 110000010101
Seed N: 010000011100

$2^{N-1}$ patterns spanned by these N seeds can be generated by linearly combining the N seeds using the XOR operator. The result of these linear combinations will always be test patterns that satisfy the functional constraint. For example, the linear combination of Seed 1 and Seed 2 produces 010000100100. This process can be repeated for different linear combinations of the N seeds any number of times. In this manner, a huge number ($2^{N-1}$) of test patterns can be provided using a relatively small subset of seeds. In effect, values outside the constraints window are filled pseudo randomly.

Figure 2:
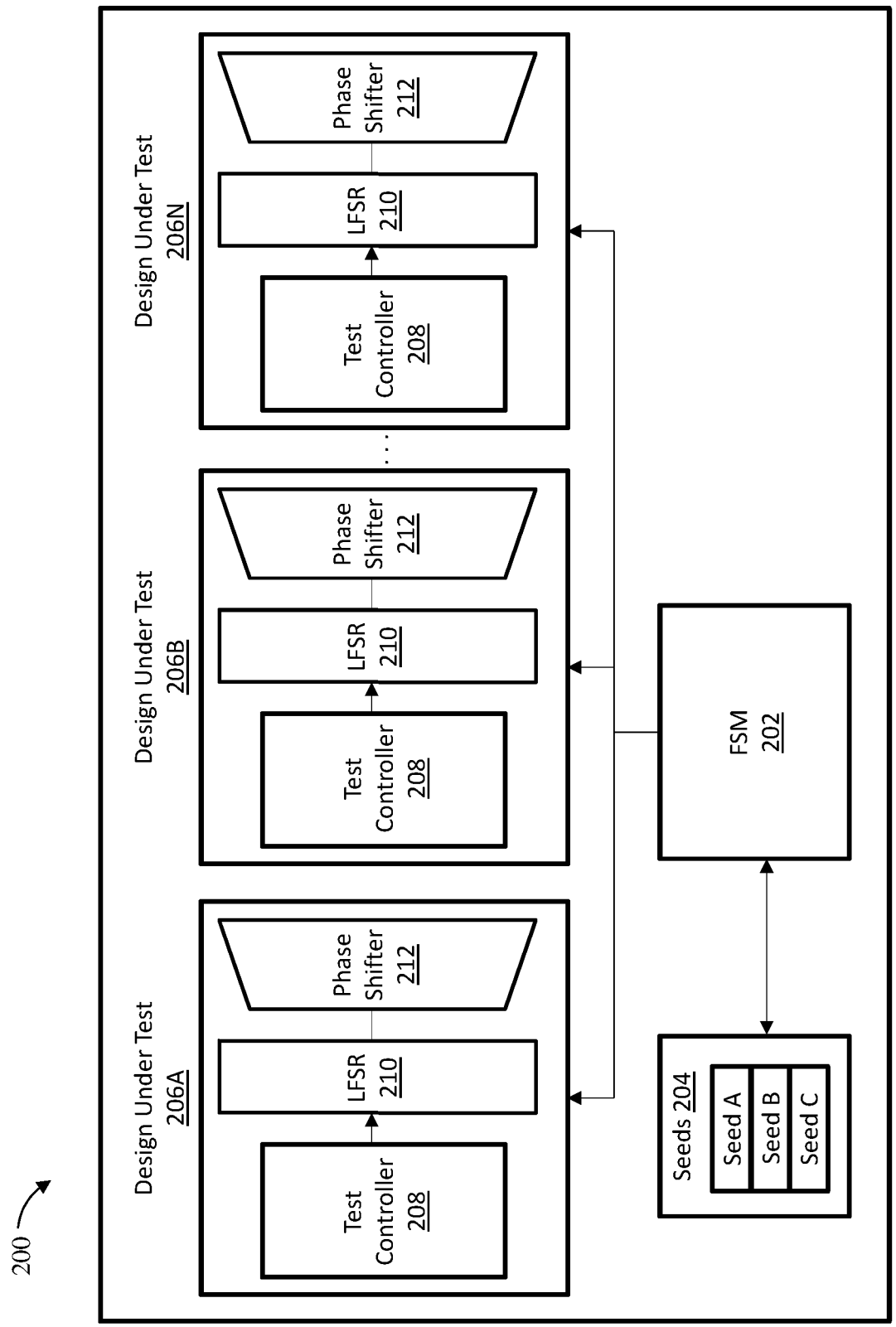
FIG. 2 illustrates a block diagram of a built-in self-test architecture that is configured to generate constrained pseudorandom test patterns for field testing an electronic circuit in accordance with various embodiments of the invention.

With reference now to FIG. 2, a BIST architecture 200 configured to generate constrained pseudorandom test patterns for field testing an electronic circuit is illustrated in accordance with a non-limiting embodiment of the present disclosure. The BIST architecture 200 includes a finite state machine (FSM) 202 communicatively coupled to on-system seeds 204. The integration of the FSM 202 allows for the seeds 204 to be stored in random access memory (RAM), unlike conventional BIST systems, in which the seeds 204 are stored off-device or in read only memory (ROM). As depicted in FIG. 2, the FSM 202 is communicatively coupled to a plurality of DUTs (and/or CUTs) 206A, 206B . . . 206N. Each of the DUTs (e.g., 206A) includes a test controller 208, an LFSR 210, and a phase shifter 212. In some embodiments of the invention, the seeds 204 are base seeds initially configured to encode a pattern satisfying one or more functional constraints. In some embodiments of the invention, a first base seed (i.e., $seed_0$) encode a pattern showing the functional constraints, while the remaining base seeds encode linearly independent patterns that fix each functional constraint (either to logic 0 or 1) to logic zero.

The FSM 202 generates a desired constrained pseudorandom test pattern using simple, low-area overhead digital circuitry on-chip. The states of the FSM 202 are the seeds, wherein $Seed_{K+1}$=function (activation condition, $Seed_K$). Simple arithmetic functions amenable for implementation via simple FSMs are used, such as the linear combination under the XOR operator, as discussed previously herein. In some embodiments of the invention, the FSM 202 includes a seed generating block for generating seeds. In some embodiments of the invention, the FSM 202 generates one or more generated seeds based on the seeds 204. In some embodiments of the invention, the FSM 202 generates one or more generated seeds by linearly combining the seeds 204 using the XOR operator.

In some embodiments of the invention, one or more generated seeds are provided by the FSM 202 to one or more of the plurality of DUTs (and/or CUTs) 206A. In some embodiments of the invention, the generated seeds are used by the test controller 208, LFSR 210, and phase shifter 212 to generate one or more test patterns (as discussed with respect to FIG. 3).

Figure 3:
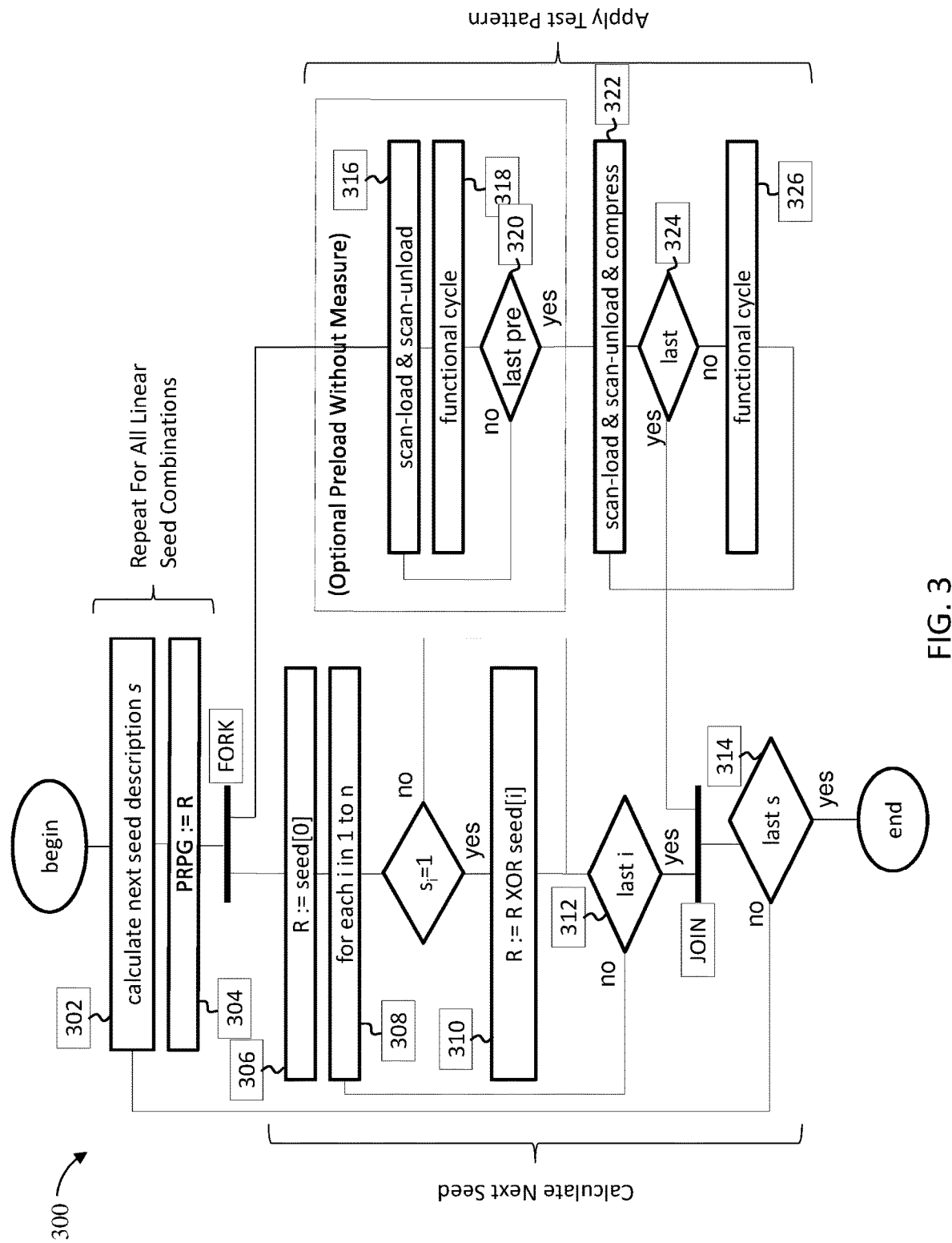
FIG. 3 illustrates a block diagram of a method for generating test patterns (new seeds) using a linear combination of stored seeds in accordance with various embodiments of the invention.

FIG. 3 depicts a block diagram of a method 300 for generating test patterns (new seeds) using a linear combination of stored seeds according to one or more embodiments. In some embodiments of the invention, the FSM 202 (depicted in FIG. 2) includes a seed generating block for generating seeds using the method 300.

At step 302, the FSM 202 initializes a seed description s, which defines the activation conditions of the stored seeds in the current step. Consider a bit vector s=[s1, s2, s3, . . . sn], si∈{0,1}. For example, s can be [00101100111001]. Let R be the linear combination of some seeds {seed}. The seeds {seed} include n entries of length m, where m is the size (bit width) of an LFSR.

At step 304, a pseudo-random pattern generator (PRPG) for the LFSR (e.g., the LFSR 210 depicted in FIG. 2) is initialized for R. For example, R can be $a_1*seed_1+a_2*seed_2+ \ldots +a_n*seed_n$), where $a_1 \ldots a_n$ are activation coefficients for the seeds 1 through n. The output from step 304 is forked and is processed in parallel at steps 306 and 316.

At step 306, R is set to seed[0], where seed[0] encodes a functional constraint. The functional constraint can include any length (number of elements) up to length m (as long as a suitable encoding is found) and need not be defined by consecutive elements. Moreover, constraints to logic values of both "0" and "1" are possible, in any order.

At step 308, for each i in 1 to n (n being the total number of entries, as above), the value of $s_i$ is evaluated. If $s_i$ is equal to 1, the method proceeds to step 310, if $s_i$ is equal to 0, the method proceeds to step 312.

At step 310, R is set to R XOR seed[i]. In other words, R is linearly combined with seed[i] using the XOR operator. For example, consider R=[001011] and seed[i]=[111000]. Setting R to R XOR seed[i] results in R=[110011].

At step 312, a check is made to determine whether the current value for i is the last i. If not, the method returns to step 308, and i is incremented (i=i+1). If the current value for i is the last i, the method proceeds to step 314.

At step 314, a check is made to determine whether the current bit vector s is the last s. If not, the method returns to step 302, and the process is repeated for the next s. If the current s is the last s, the method is complete.

Steps 316, 318, and 320 include an optional preload without measure. A preload without measure allows for a dummy scan/unload. At step 320, a check is made to determine whether additional preloads are available. If so, the method returns to step 316; if not, the method proceeds to step 322.

At step 322, the scan-load, scan-unload, and compress operations are initialized using the test pattern. At step 324, a check is made to determine whether the current test pattern (R) is the last. If so, the method returns to step 314, where the output is joined to the output of step 312. If not, the method proceeds to step 326, where the functional cycle is incremented, prior to repeating the process at step 322.

Figure 4:
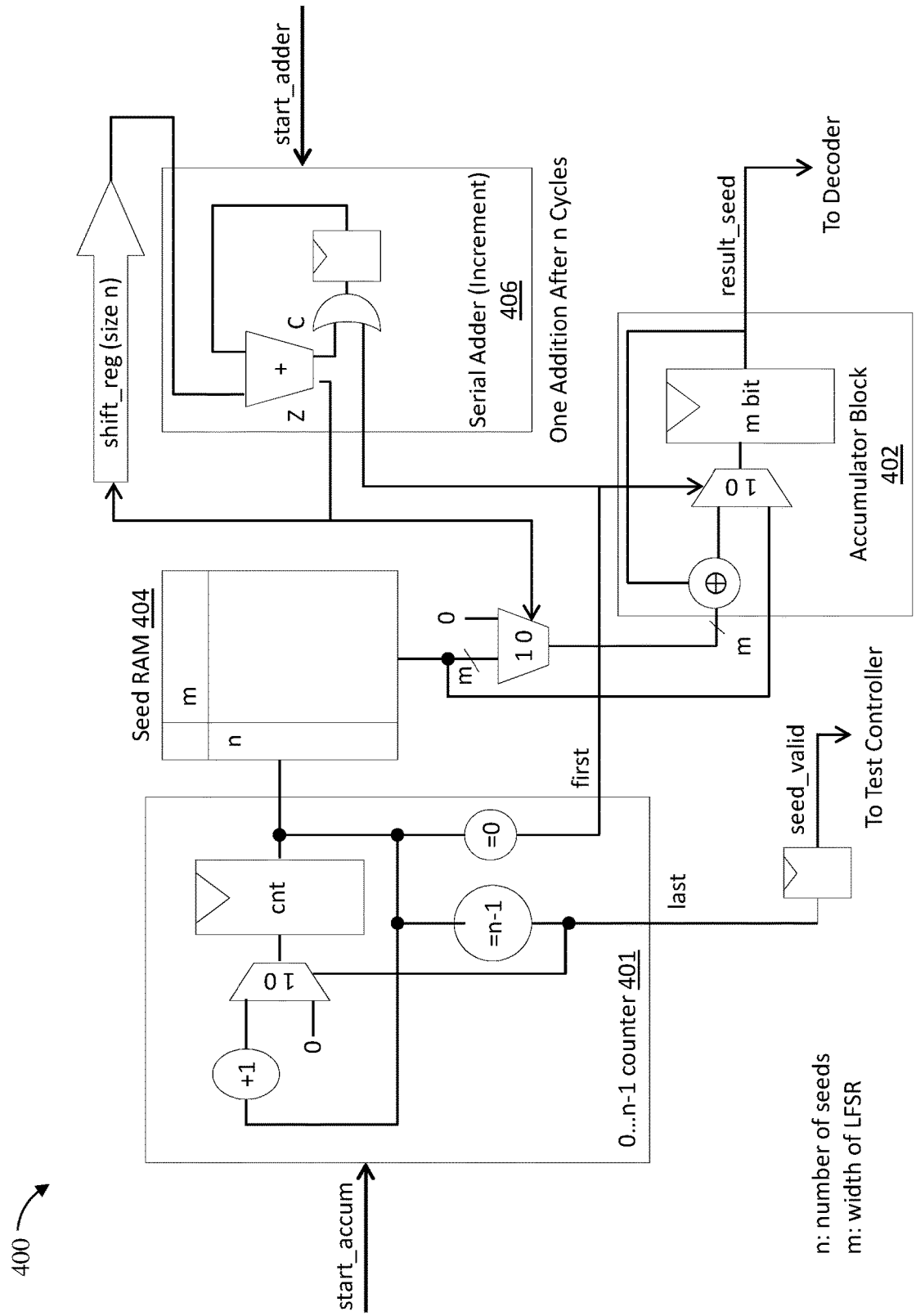
FIG. 4 illustrates a block diagram of a finite state machine in accordance with various embodiments of the invention.

FIG. 4 illustrates a block diagram of a FSM 400 in accordance with a non-limiting embodiment of the present disclosure. In some embodiments of the invention, the FSM 400 can include an accumulator block 402. The accumulator block 402 is configured to accumulate seeds from the seed RAM 404. The seed RAM 404 can include n seeds, each having a width of m elements (the width of the LFSR). In some embodiments of the invention, the FSM 400 includes a serial adder 406 for calculating the next seed description s (see 306 in FIG. 3). As depicted, the serial adder 406 can be configured to make one addition after n cycles.

The counter 401 controls that every n cycle of the FSM 400, a test pattern ("result_seed") is output to a decoder (e.g., the decoder 108 in FIG. 1, or the LFSR 210 and phase shifter 212 in FIG. 2). Similarly, a validity indication ("seed_ valid") can be provided to a test controller (e.g., the test controller 208 depicted in FIG. 2).

Figure 5:
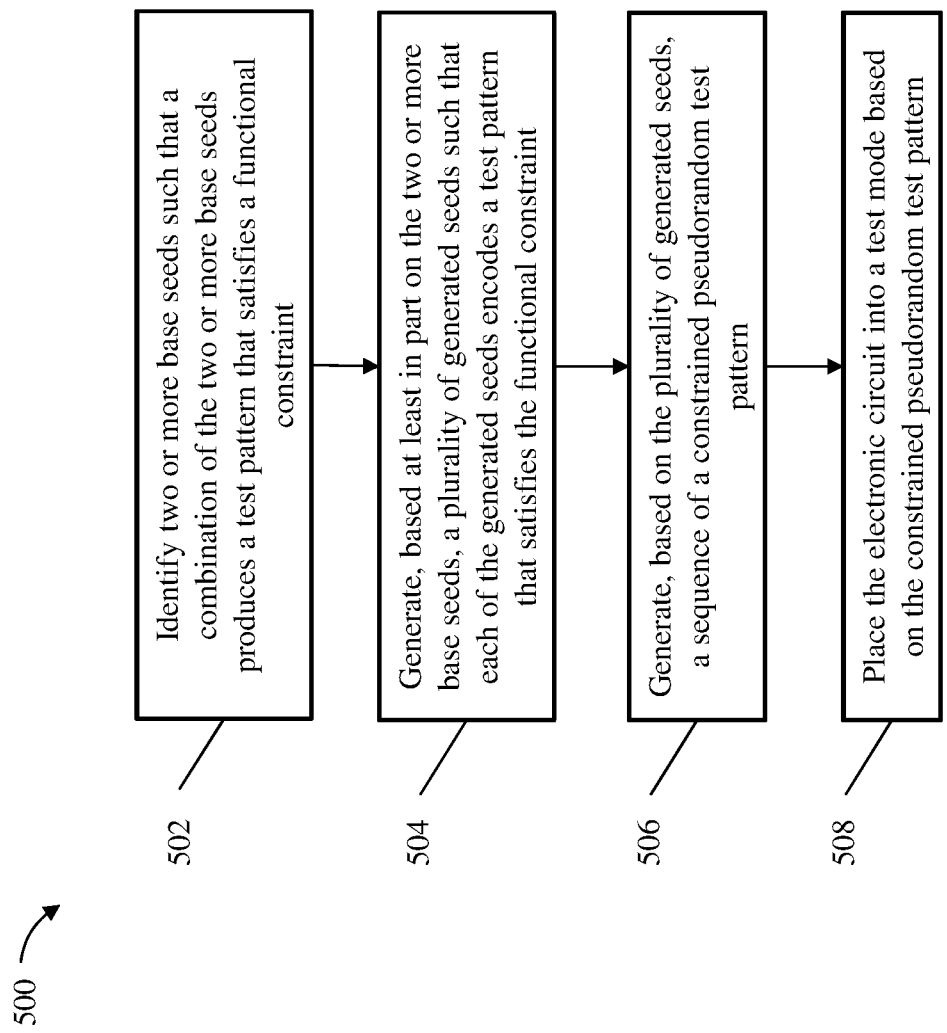
FIG. 5 is a flow diagram illustrating a method according to a non-limiting embodiment of the invention.

FIG. 5 depicts a flow diagram 500 illustrating a method for field testing an electronic circuit according to a non-limiting embodiment. As shown at block 502, two or more base seeds are identified such that a combination of the two or more base seeds produces a test pattern that satisfies a functional constraint. In some embodiments of the invention, the functional constraint includes a fixed value for one or more bits in a bit vector. For example, the constrained pseudorandom test pattern can include a first bit(s) defined by the functional constraint and a second bit(s) that is filled randomly, as discussed previously herein. At block 504, a plurality of generated seeds is generated based on the two or more base seeds. The generated seeds can be constructed from the base seeds such that each of the generated seeds encodes a test pattern that satisfies the functional constraint.

At block 506, a sequence of a constrained pseudorandom test pattern is generated based on the plurality of generated seeds. In some embodiments of the invention, the constrained pseudorandom test pattern is produced from a linear combination of at least two generated seeds. In some embodiments of the invention, the constrained pseudorandom test pattern is produced from a linear combination evaluated using the XOR operator. The constrained pseudorandom test pattern can be generated each capture cycle of a built-in self-test controller of a finite state machine (e.g., the finite state machine 202 depicted in FIG. 2 or the finite state machine 400 depicted in FIG. 4). In some embodiments of the invention, the process of scanning a test pattern in and out and applying one or more capture cycles occurs during each BIST cycle of a BIST controller. In this manner, a new seed is generated (and hence produces a test pattern) for each capture cycle. This operation can require many clock cycles.

At block 508, the electronic circuit (device-under-test, circuit-under-test) is placed into a test mode based on the constrained pseudorandom test pattern according to one or more embodiments. The method can further include placing the electronic circuit into a normal mode and comparing an output of the test mode to an output of the normal mode. In this manner, constrained pseudorandom test patterns can be used for an in-system BIST of the electronic circuit.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The invention claimed is:

1. A built-in self-test system for an electronic circuit, the built-in self-test system comprising:
   a memory comprising two or more base seeds;
   seed generation logic configured to generate, based at least in part on the two or more base seeds, a plurality of generated seeds such that each of the generated seeds encodes a test pattern that satisfies a functional constraint;
   a finite state machine configured to generate, based on the plurality of generated seeds, a sequence of constrained pseudorandom test patterns; and
   a test controller operable to place the electronic circuit into a test mode based on the constrained pseudorandom test pattern.

2. The built-in self-test system of claim 1, wherein each of the constrained pseudorandom test patterns comprises a linear combination of at least two of the base seeds.

3. The built-in self-test system of claim 2, wherein the linear combination comprises an XOR operator.

4. The built-in self-test system of claim 1, wherein the functional constraint comprises a fixed value for one or more bits in a bit vector.

5. The built-in self-test system of claim 1, wherein the test controller is further operable to place the electronic circuit into a normal mode.

6. The built-in self-test system of claim 5, wherein the test controller is further operable to compare an output of the test mode to an expected output.

7. The built-in self-test system of claim 1, wherein the constrained pseudorandom test pattern comprises a first bit and a second bit, the first bit is defined by the functional constraint, and the second bit is filled randomly.

8. A method for testing an electronic circuit, the method comprising:
   identifying two or more base seeds such that a combination of the two or more base seeds produces a test pattern that satisfies a functional constraint;
   generating, based at least in part on the two or more base seeds, a plurality of generated seeds such that each of the generated seeds encodes a test pattern that satisfies the functional constraint;
   generating, based on the plurality of generated seeds, a sequence of a constrained pseudorandom test pattern; and
   placing the electronic circuit into a test mode based on the constrained pseudorandom test pattern.

9. The method of claim 8, wherein the constrained pseudorandom test pattern comprises a linear combination of at least two of the base seeds.

10. The method of claim 9, wherein the linear combination comprises an XOR operator.

11. The method of claim 8, wherein the functional constraint comprises a fixed value for one or more bits in a bit vector.

12. The method of claim 8 further comprising placing the electronic circuit into a normal mode.

13. The method of claim 12 further comprising comparing an output of the test mode to an expected output.

14. The method of claim 8, wherein the constrained pseudorandom test pattern comprises a first bit and a second bit, the first bit is defined by the functional constraint, and the second bit is filled randomly.

15. A computer program product for testing an electronic circuit, the computer program product comprising a computer readable storage medium having program instructions embodied therewith, the program instructions executable by an electronic computer processor to control a computer system to perform operations comprising:
   identifying two or more base seeds such that a combination of the two or more base seeds produces a test pattern that satisfies a functional constraint;
   generating, based at least in part on the two or more base seeds, a plurality of generated seeds such that each of the generated seeds encodes a test pattern that satisfies the functional constraint;
   generating, based on the plurality of generated seeds, a sequence of a constrained pseudorandom test pattern; and
   placing the electronic circuit into a test mode based on the constrained pseudorandom test pattern.

16. The computer program product of claim 15, wherein the constrained pseudorandom test pattern comprises a linear combination of at least two of the base seeds.

17. The computer program product of claim 15, wherein the functional constraint comprises a fixed value for one or more bits in a bit vector.

18. The computer program product of claim 15 further comprising placing the electronic circuit into a normal mode.

19. The computer program product of claim 18 further comprising comparing an output of the test mode to an expected output.

20. The computer program product of claim 15, wherein the constrained pseudorandom test pattern comprises a first bit and a second bit, the first bit is defined by the functional constraint, and the second bit is filled randomly.

* * * * *